(12) United States Patent
Kang et al.

(10) Patent No.: US 9,355,947 B2
(45) Date of Patent: May 31, 2016

(54) PRINTED CIRCUIT BOARD HAVING TRACES AND BALL GRID ARRAY PACKAGE INCLUDING THE SAME

(71) Applicant: Samsung Electronics Co., Ltd., Suwon-si, Gyeonggi-do (KR)

(72) Inventors: Hyo-soon Kang, Seoul (KR); Sun-won Kang, Seongnam-si (KR); Joon-young Park, Seoul (KR); Doo-hee Hwang, Seongnam-si (KR); Tae-young Yoon, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/698,826

(22) Filed: Apr. 28, 2015

(65) Prior Publication Data
US 2015/0332993 A1 Nov. 19, 2015

(30) Foreign Application Priority Data
May 14, 2014 (KR) ........................ 10-2014-0057949

(51) Int. Cl.
*H01L 23/00* (2006.01)
*H01L 23/498* (2006.01)

(52) U.S. Cl.
CPC .... *H01L 23/49816* (2013.01); *H01L 23/49838* (2013.01); *H01L 24/13* (2013.01); *H01L 24/16* (2013.01); *H01L 24/17* (2013.01); *H01L 24/48* (2013.01); *H01L 24/49* (2013.01); *H01L 24/81* (2013.01); *H01L 24/85* (2013.01); *H01L 2924/014* (2013.01); *H01L 2924/15331* (2013.01)

(58) Field of Classification Search
CPC ......... H01L 24/13; H01L 24/48; H01L 24/81; H01L 24/16; H01L 24/85
See application file for complete search history.

(56) References Cited

U.S. PATENT DOCUMENTS

| | | | | |
|---|---|---|---|---|
| 3,795,845 A | * | 3/1974 | Cass | H01L 23/488 257/786 |
| 5,417,577 A | * | 5/1995 | Holliday | H05K 3/368 29/830 |
| 5,491,364 A | * | 2/1996 | Brandenburg | H01L 23/49838 257/666 |
| 5,691,569 A | * | 11/1997 | Palmer | H01L 23/49811 257/692 |
| 5,729,894 A | * | 3/1998 | Rostoker | G03F 7/70433 257/693 |
| 5,784,262 A | * | 7/1998 | Sherman | H05K 1/114 174/261 |
| 5,864,470 A | * | 1/1999 | Shim | H01L 23/3677 174/254 |
| 6,010,058 A | | 1/2000 | Kim et al. | |
| 6,215,184 B1 | | 4/2001 | Stearns et al. | |
| 6,268,568 B1 | * | 7/2001 | Kim | H01L 23/49816 174/250 |
| 6,310,398 B1 | * | 10/2001 | Katz | H01L 23/49838 257/690 |

(Continued)

FOREIGN PATENT DOCUMENTS

| | | |
|---|---|---|
| JP | 2007012690 A | 1/2007 |
| JP | 2008182062 A | 8/2008 |
| KR | 20060121604 | 11/2006 |

*Primary Examiner* — Ngan Ngo
(74) *Attorney, Agent, or Firm* — Renaissance IP Law Group LLP

(57) ABSTRACT

A printed circuit board (PCB) includes a base substrate including upper and lower surfaces, a plurality of solder ball pads separately formed on the lower surface of the base substrate in a radial direction and forming one or more radial pad groups, a plurality of first traces respectively connected to the plurality of solder ball pads and extending to an inside of the radial pad group, and a plurality of second traces respectively connected to the plurality of first traces and extending to an outside of the radial pad group.

20 Claims, 11 Drawing Sheets

(56) References Cited

U.S. PATENT DOCUMENTS

| | | | | |
|---|---|---|---|---|
| 6,664,620 B2 * | 12/2003 | Siu | H01L 23/49811 | 257/690 |
| 6,793,500 B1 * | 9/2004 | Budell | H01L 23/49838 | 174/51 |
| 7,968,997 B2 | 6/2011 | Takemoto | | |
| 7,979,983 B2 * | 7/2011 | Bird | H05K 1/113 | 174/262 |
| 8,053,349 B2 * | 11/2011 | Rhyner | H01L 21/4853 | 257/778 |
| 8,125,064 B1 * | 2/2012 | Lee | H01L 23/13 | 257/684 |
| 8,344,266 B2 * | 1/2013 | Bird | H05K 1/113 | 174/260 |
| 8,680,691 B2 * | 3/2014 | Kariyazaki | H01L 23/49816 | 257/698 |
| 8,804,364 B2 * | 8/2014 | Li | H05K 1/113 | 174/260 |
| 2003/0000738 A1 * | 1/2003 | Rumsey | H01L 23/544 | 174/260 |
| 2006/0261451 A1 * | 11/2006 | Nakatsu | H01L 23/49838 | 257/673 |
| 2009/0283894 A1 * | 11/2009 | Lee | H01L 23/481 | 257/691 |
| 2009/0302878 A1 * | 12/2009 | Sherry | G01R 1/06716 | 324/754.14 |
| 2013/0211776 A1 | 8/2013 | Grivna | | |
| 2014/0220744 A1 * | 8/2014 | Damberg | H01L 25/50 | 438/127 |
| 2015/0206832 A1 * | 7/2015 | Kudo | H01L 23/49816 | 257/676 |

* cited by examiner

PRINTED CIRCUIT BOARD HAVING TRACES AND BALL GRID ARRAY PACKAGE INCLUDING THE SAME

CROSS-REFERENCE TO RELATED APPLICATION

This application claims the benefit of Korean Patent Application No. 10-2014-0057949, filed on May 14, 2014, in the Korean Intellectual Property Office, the disclosure of which is incorporated herein in its entirety by reference.

BACKGROUND

The inventive concept relates to a printed circuit board (PCB) and a ball grid array (BGA) package including the same, and more particularly, to a PCB having traces and a BGA package including the same.

To reduce the overall size and weight of electronic devices, the size of a semiconductor package has been reduced and highly-integrated high performance semiconductor chips have been manufactured. Along with this trend, packages of various types, such as a BGA package, have been developed to realize more cost-effective and more reliable semiconductor packages.

A PCB included in a BGA package includes solder balls as connection units for connecting the PCB to a mother board and traces capable of routing signals from a predetermined place to the solder balls.

SUMMARY

An inventive concept provides a printed circuit board (PCB) and a ball grid array (BGA) package capable of preventing signal distortion and maintaining reliability.

According to an aspect of the inventive concept, there is provided a printed circuit board (PCB) including a base substrate including upper and lower surfaces opposite to each other, a plurality of solder ball pads formed on the lower surface of the base substrate in a radial direction and forming one or more radial pad groups, a plurality of first traces respectively connected to the plurality of solder ball pads and extending to an inside of the radial pad group, and a plurality of second traces respectively connected to the plurality of first traces and extending to an outside of the radial pad group.

The plurality of first traces may have substantially equal lengths. The plurality of solder ball pads may be arranged at uniform intervals.

One end of each of the plurality of first traces may extend toward each of the plurality of solder ball pads and other end of each of the plurality of first traces may extend toward a substantially center region of the radial pad group.

Solder ball pads that belong to the radial pad group among the plurality of solder ball pads may be arranged at substantially equal angles with respect to the center of the radial pad group.

The PCB may further include an opening formed in a center thereof and the plurality of solder ball pads may be arranged to surround the opening.

Each two groups among the radial pad groups may share one or more solder ball pads among the plurality of solder ball pads.

According to another aspect of the inventive concept, there is provided a ball grid array (BGA) package including a PCB including upper and lower surfaces, a semiconductor chip mounted on the upper surface of the PCB, and a plurality of solder balls attached to a plurality of solder ball pads formed on the lower surface of the PCB. The plurality of solder ball pads are arranged in a radial direction and form one or more radial pad groups. The PCB includes a plurality of first traces respectively connected to the plurality of solder ball pads and extending to an inside of the radial pad group and a plurality of second traces respectively connected to the plurality of first traces and extending to an outside of the radial pad group.

The semiconductor chip may be mounted on the PCB by flip-chip bonding through a plurality of bumps. At least some of the plurality of bumps may form one or more radial bump groups.

The PCB may further include a plurality of third traces respectively connected to the plurality of bumps and extending to an inside of the radial bump group. One end of each of the plurality of second traces may be connected to each of the plurality of first traces. The other end of each of the plurality of second traces may extend to the inside of the radial bump group and may be connected to each of the plurality of third traces.

The BGA package may further include an adhesive layer for attaching the semiconductor chip and the PCB, conductive pads formed on an upper surface of the semiconductor chip, and wires for electrically connecting the conductive pads and the PCB.

The semiconductor chip may be mounted on the upper surface of the PCB in a face-down manner. The PCB may include first conductive pads, each of which is electrically connected to one end of each of the plurality of second traces, and an opening (or slit) that exposes second conductive pads formed on a lower surface of the semiconductor chip. The first conductive pads and the second conductive pads may be electrically connected.

The lower surface of the PCB may include a mounting region corresponding to a region in which the semiconductor chip is mounted on the upper surface of the PCB. The plurality of solder ball pads may be arranged to surround the mounting region.

The lower surface of the PCB may include a mounting region corresponding to a region in which the semiconductor chip is mounted on the upper surface of the PCB. The plurality of solder ball pads may be arranged in the mounting region.

According to another aspect of the inventive concept, there is provided a PCB including a plurality of solder ball pads separately arranged in a radial direction and forming one or more radial pad groups and a plurality of traces respectively connected to the plurality of solder ball pads and extending to an outside of the radial pad group. The plurality of traces have substantially equal lengths.

The plurality of solder ball pads may be separately arranged at uniform intervals.

The plurality of traces may include a plurality of first traces respectively connected to the plurality of solder ball pads and extending to an inside of the radial pad group and a plurality of second traces respectively connected to the plurality of first traces and extending to an outside of the radial pad group. The plurality of first traces may have substantially equal lengths.

One end of each of the plurality of first traces may extend toward each of the plurality of solder ball pads. Other end of each of the plurality of first traces may extend toward a center of the radial pad group.

BRIEF DESCRIPTION OF THE DRAWINGS

Exemplary embodiments of the inventive concept will be more clearly understood from the following detailed description taken in conjunction with the accompanying drawings in which:

FIG. 1A is a cross-sectional view of the BGA package;

FIG. 1B is a bottom view of the PCB;

FIG. 1C is a partially enlarged view of the region C_1 of FIG. 1B;

FIG. 1D is a partially enlarged view of the region D_1 of FIG. 1C;

FIG. 6A is a cross-sectional view of the BGA package;

FIG. 6B is a bottom view of the PCB corresponding to the region B_6 of FIG. 6A;

FIG. 7A is a cross-sectional view of the BGA package;

FIG. 7B is a bottom view of the PCB corresponding to the region B_7 of FIG. 7A;

DETAILED DESCRIPTION OF THE EMBODIMENTS

Figure 1A:
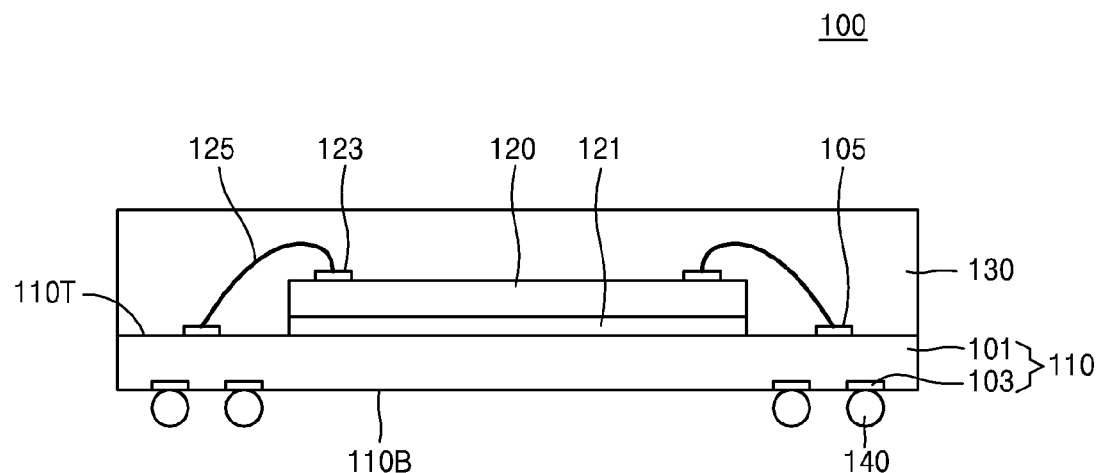
FIGS. 1A to 1D are views illustrating a ball grid array (BGA) package including a printed circuit board (PCB) according to an embodiment of the inventive concept.

The inventive concept will now be described more fully with reference to the accompanying drawings, in which exemplary embodiments of the inventive concept are shown. The same elements in the drawings are denoted by the same reference numerals and a repeated explanation thereof will not be given.

The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art.

It will be understood that, although the terms first and second, etc., may be used herein to describe various members, regions, layers, portions, and/or elements, these members, regions, layers, portions, and/or elements should not be limited by these terms. These terms are only used to distinguish one member, region, layer, portion, or element from another member, region, layer, portion, or element. For example, a first element may be named a second element and similarly a second element may be named a first element without departing from the scope of the inventive concept.

Unless otherwise defined, all terms (including technical and scientific terms) used herein have the same meanings as commonly understood by one of ordinary skill in the art to which this inventive concept belongs.

When a certain embodiment may be differently implemented, a specific process may be performed in an order different from a described order. For example, continuously described two processes may be simultaneously performed and may be performed in an order opposite to a described order.

In the accompanying drawings, for example, in accordance with manufacturing technology and/or allowance, modifications of illustrated shapes may be estimated. Therefore, in the exemplary embodiments of the inventive concept, regions illustrated in the current specification should not be construed as limited to specific shapes and should include changes in shapes caused in manufacturing processes.

Figure 1B:
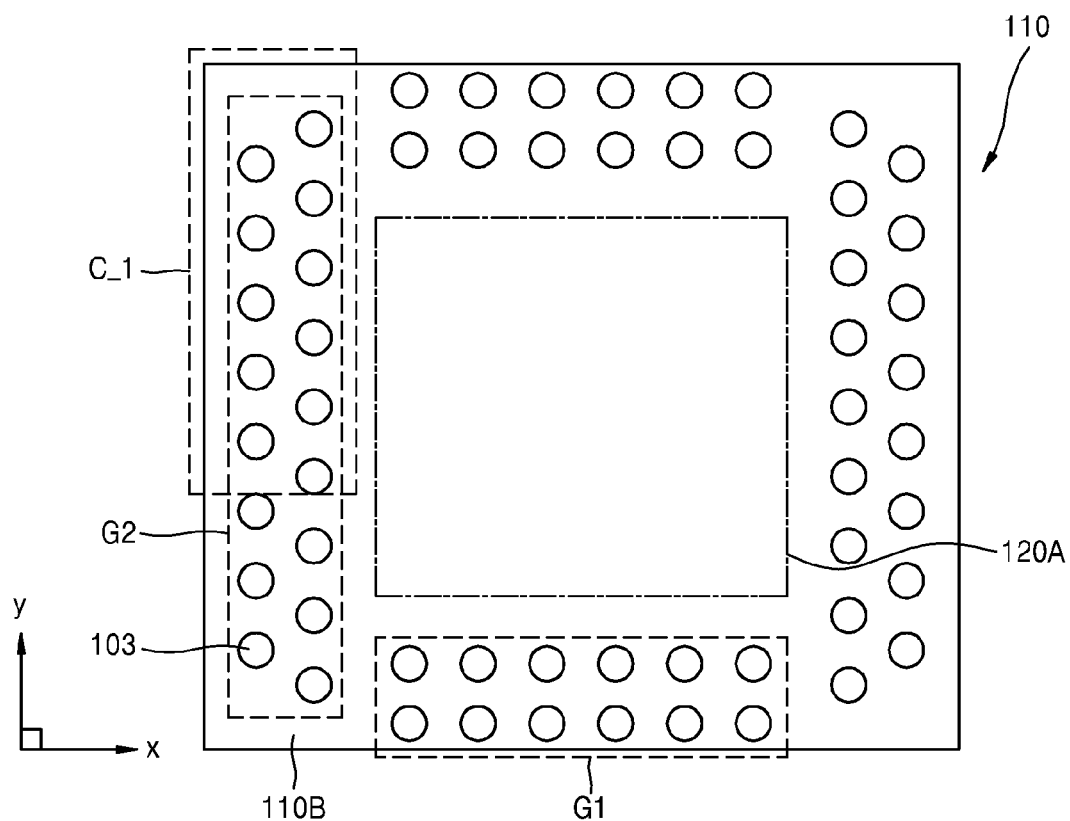
Figure 1C:
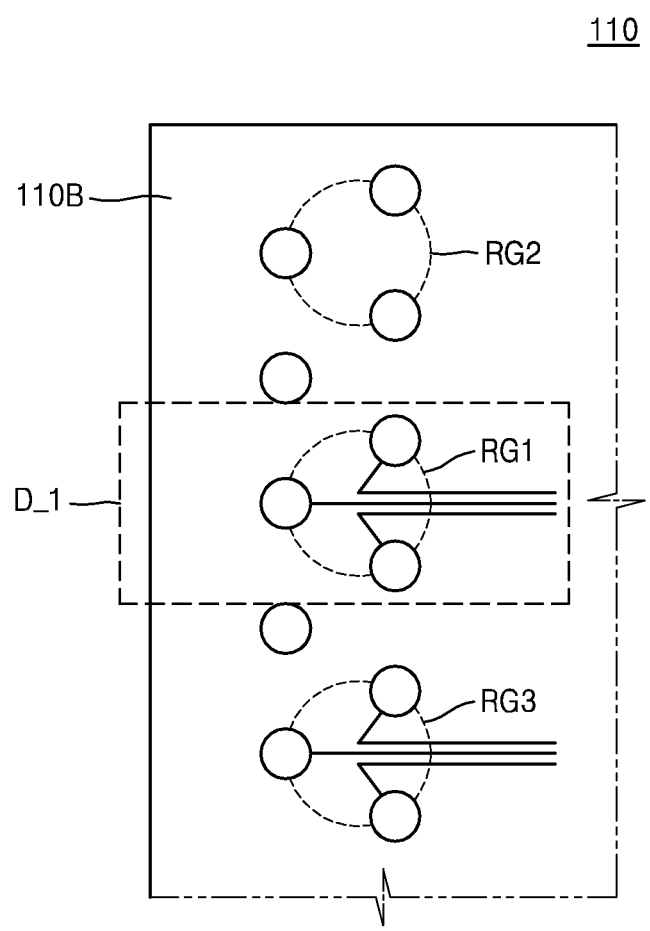
Figure 1D:
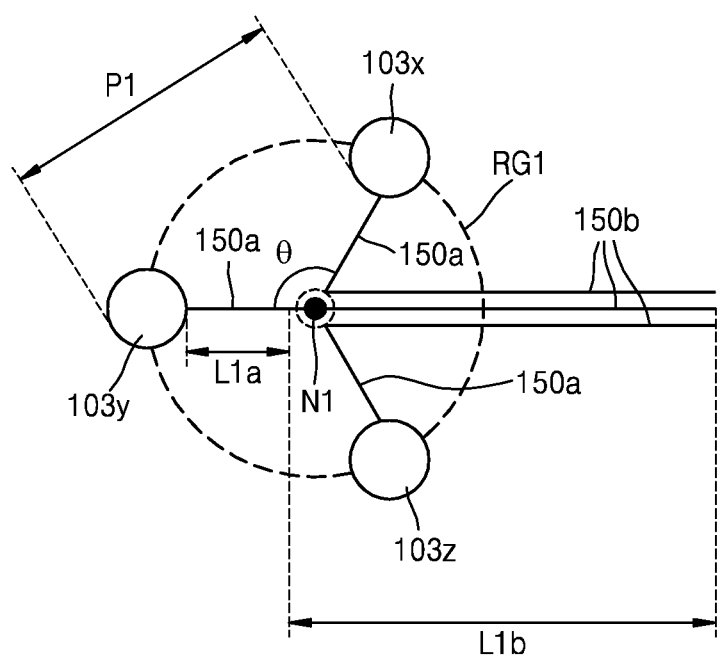

FIGS. 1A to 1D are various cross-sectional and plan views illustrating a ball grid array (BGA) package 100 including a printed circuit board (PCB) 110 according to an embodiment of the inventive concept. FIG. 1A is a cross-sectional view of the BGA package 100. FIG. 1B is a bottom view of the PCB 110. FIG. 1C is a partially enlarged view of region C_1 of FIG. 1B. FIG. 1D is a partially enlarged view of region D_1 of FIG. 1C.

Referring to FIG. 1A, the BGA package 100 includes the PCB 110, a semiconductor chip 120 mounted on an upper surface of the PCB 110, a mold unit 130 that covers the upper surface of the PCB 110 and the semiconductor chip 120, and solder balls 140 attached to a lower surface of the PCB 110.

The PCB 110 may be a single-sided PCB, a double-sided PCB, or a multi-layer PCB including one or more internal wiring patterns in a substrate. Furthermore, the PCB 110 may be a rigid PCB or a flexible PCB.

The PCB 110 may include a base substrate 101, a plurality of solder ball pads 103, and a plurality of conductive traces 150a and 150b (refer to FIG. 1D).

Although not shown, the PCB 110 may include at least one insulating layer and a conductive wiring layer such as a metal wiring layer. The metal wiring layer may be formed of a metal such as aluminium (Al) or copper (Cu) as a circuit pattern in the PCB 110. In some embodiments, a surface of the metal wiring layer may be plated with tin (Sn), gold (Au), nickel (Ni), lead (Pb) or combinations thereof.

In addition, the PCB 110 may further include conductive pads 105 formed on an upper surface of a base substrate 101 and connected to the semiconductor chip 120 and a via contact (not shown) for connecting the conductive pads 105 and the solder ball pads 103 through the base substrate 101. The conductive pads 105 may be formed of, for example, Al or Cu.

The conductive pads 105 may be positioned at a higher level than an upper surface 110T of the PCB 110. However, the inventive concept is not limited thereto. The conductive pads 105 may be buried in the PCB 110 to be positioned at a same level with or a lower level than the upper surface 110T of the PCB 110.

Furthermore, the PCB 110 may further include a protective layer (not shown) that exposes only the conductive pads 105 and the solder ball pads 103 and covers all other regions on the PCB 110. The protective layer may be formed of a photo-solder resist that may be patterned by a photolithography process. The protective layer may be solder mask defined (SMD) so that the conductive pads 105 and the solder ball pads 103 are partially exposed or may be non-solder mask defined (NSMD) so that the conductive pads 105 and the solder ball pads 103 are entirely exposed.

The base substrate 101 may be a flat plate including the upper and lower surfaces opposite to each other. The base substrate 101 may include, for example, an epoxy resin, polyimide resin, bismalemide triazine (BT) resin, flame retardant 4 (FR-4), FR-5, ceramic, silicon, glass, photosensitive liquid dielectrics, photosensitive dry-film dielectrics, polyimide flexible film thermally cured dry films, thermally cured liquid dielectrics, resin coated copper foil (RCC), thermoplastic, or flexible resin. The base substrate 101 may be a single layer or a multi-layer including wiring patterns. For example, the base substrate 101 may be a single rigid flat plate or may be formed by attaching a plurality of rigid flat plates to each other or by attaching thin flexible PCBs and rigid flat plates to each other. Each of the plurality of rigid flat plates or PCBs that are attached to each other may include a wiring pattern. In addition, the base substrate 101 may be a low temperature co-fired ceramic (LTCC) substrate that may be formed by stacking a plurality of ceramic layers, each of which may include a wiring pattern.

The plurality of solder ball pads 103 are formed on the lower surface of the base substrate 101 and the plurality of solder balls 140 are respectively attached to the plurality of solder ball pads 103.

The solder ball pads 103 may be electrically connected with the plurality of conductive traces 150a and 150b (refer to FIG. 1D), the metal wiring layer (not shown), or the conductive pads 105 formed on the PCB 110 so that signals may be transmitted from the semiconductor chip 120 to the plurality of solder balls 140 or vice versa.

The solder ball pads 103 may be formed of, for example, Al or Cu. In some embodiments, a surface of the solder ball pad 103 may be plated with Sn, Au, Ni, Pb or combinations thereof.

The solder ball pads 103 may be formed at substantially the same level with the lower surface 110B of the PCB 110. However, the inventive concept is not limited thereto. The solder ball pads 103 may be formed at a lower level than the lower surface 110B of the PCB 110 and protrude therefrom or may be formed at a higher level than the lower surface 110B of the PCB 110 and be buried therein.

Various arrangement structures of the plurality of solder ball pads 103 on a plane will be described later with reference to FIGS. 1B to 1D.

The semiconductor chip 120 may be mounted on the upper surface 110T of the PCB 110. The semiconductor chip 120 may be a memory device, a logic device such as a microprocessor, an analog device, a digital signal processor, a system-on-chip and so on. In addition, the semiconductor chip 120 may have a multi-chip structure in which at least two semiconductor chips are stacked. For example, the at least two semiconductor chips may be memory devices of the same type or one of the at least two semiconductor chips may be a memory device and the other one may be a controller.

Figure 6A:
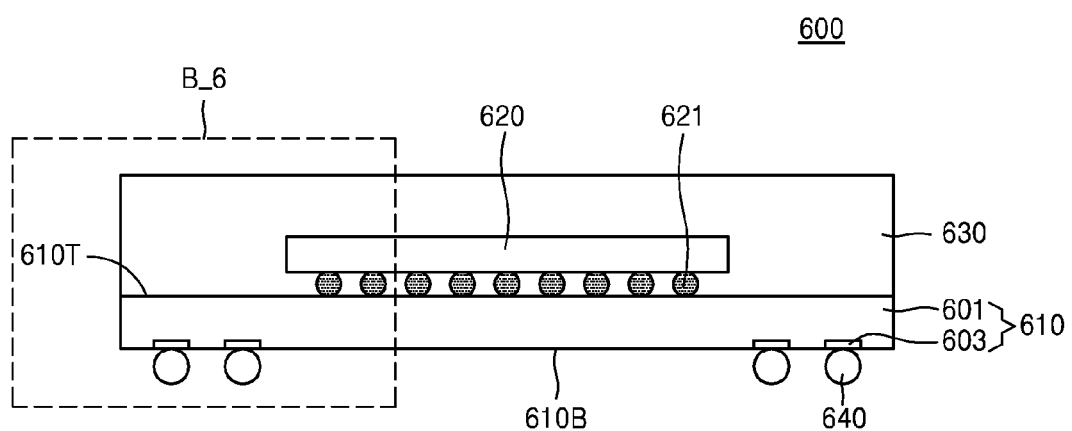
FIGS. 6A and 6B are views illustrating a BGA package including a PCB according to another embodiment of the inventive concept.

The semiconductor chip 120 may be coupled to the PCB 110 by wire bonding as illustrated in FIG. 1A or may be coupled to the PCB 110 by flip-chip bonding (refer to FIG. 6A).

According to the current embodiment, when the semiconductor chip 120 is coupled to the PCB 110 by the wire bonding, the semiconductor chip 120 may be attached to the upper surface 110T of the PCB 110 using an adhesive tape 121. And the semiconductor chip 120 and the PCB 110 are electrically connected through bonding wires 125. For example, one end of each of the bonding wires 125 may be connected to a corresponding one of the conductive pads 105 formed on the PCB 110 and other end thereof may be connected to a corresponding one of chip conductive pads (or bonding pads) 123 formed on the semiconductor chip 120 so that the semiconductor chip 120 and the PCB 110 may be electrically connected.

In some embodiments, the bonding wires 125 may be formed of Au or Al and may be ball bonded or wedge bonded.

In some embodiments, the bonding wires 125 may be connected to the conductive pads 105 and the chip conductive pads 123 by thermo-compression bonding or ultrasonic bonding and by thermo-sonic bonding in which the thermo-compression bonding and the ultrasonic bonding are mixed.

The mold unit 130 encapsulates the semiconductor chip 120 and the bonding wires 125 on the upper surface 110T of the PCB 110 to protect the semiconductor chip 120 and the bonding wires 125 against external factors.

Regarding the mold unit 130, an appropriate amount of a molding resin is provided onto the semiconductor chip 120 via a device for providing the molding resin (for example, a nozzle) and the semiconductor chip 120 covered with the molding resin is pressed using a pressing element (not shown) such as a press so that an external shape of the semiconductor package 100 is formed according to an internal shape of the pressing element.

Process conditions such as a delay between the deposition of the molding resin and pressing thereof, the amount of deposited molding resin, a pressing temperature, and a pressure may be set in consideration of the physical characteristics such as viscosity of the molding resin.

In some embodiments, the molding resin may be an epoxy-group molding resin or polyimide-group molding resin. The epoxy-group molding resin may be, for example, a polycyclic aromatic epoxy resin, bisphenol-group epoxy resin, naphthalene-group epoxy resin, ortho-cresol novolac epoxy resin, dicyclopentadiene epoxy resin, biphenyl-group epoxy resin, or phenol novolac epoxy resin.

In some embodiments, the molding resin may include carbon black that is a colorant. On the other hand, the molding resin may further include a hardener, a hardening accelerator, a filler, and a flame retardant.

The hardener may be formed of, for example, amine, polycyclic aromatic phenol resin, phenol novolac resin, cresol novolac resin, dicyclopentadiene phenol resin, xyloc resin, and naphthalene resin.

The hardening accelerator as a catalyst for accelerating a hardening reaction between the epoxy-group molding resin and the hardener may be formed of, for example, tertiary amines such as benzyldimethylamine, triethanolamine, triethylenediamine, dimethylaminoethanol, and tris(dimethylaminomethyl)phenol, imidazol such as 2-methylimidazol and 2-phenylimidazol, organic phosphine such as triphenylphosphine, diphenylphosphine, and phenylphosphine, and tetraphenyl boron salt such as tetraphenylphosphonium, tetraphenylborate, and triphenylphosphine.

In some embodiments, the filler may be formed of silica and the flame retardant may be formed of brominated epoxy resin, antimony oxide, and metal hydride.

The molding resin may further include a mold release agent such as high quality fatty acid, high quality fatty acid metal salt, and ester-based wax and a tension relaxant such as modified silicone oil, silicon powder, and silicon resin.

The molding resin may have a viscosity suitable for the molding process conditions. For example, the molding resin may be a fluidic solid such as gel.

Referring to FIGS. 1B and 1C, the PCB 110 includes the plurality of solder ball pads 103 formed on the lower surface 110B of the PCB 110. Hereinafter, for the sake of convenience, the plurality of solder balls 140 are not illustrated in FIGS. 1B to 1D.

The lower surface 110B of the PCB 110 includes a mounting region 120A corresponding to a region for mounting the semiconductor chip 120 (refer to FIG. 1A) on the upper surface 110T of the PCB 110.

Figure 2:
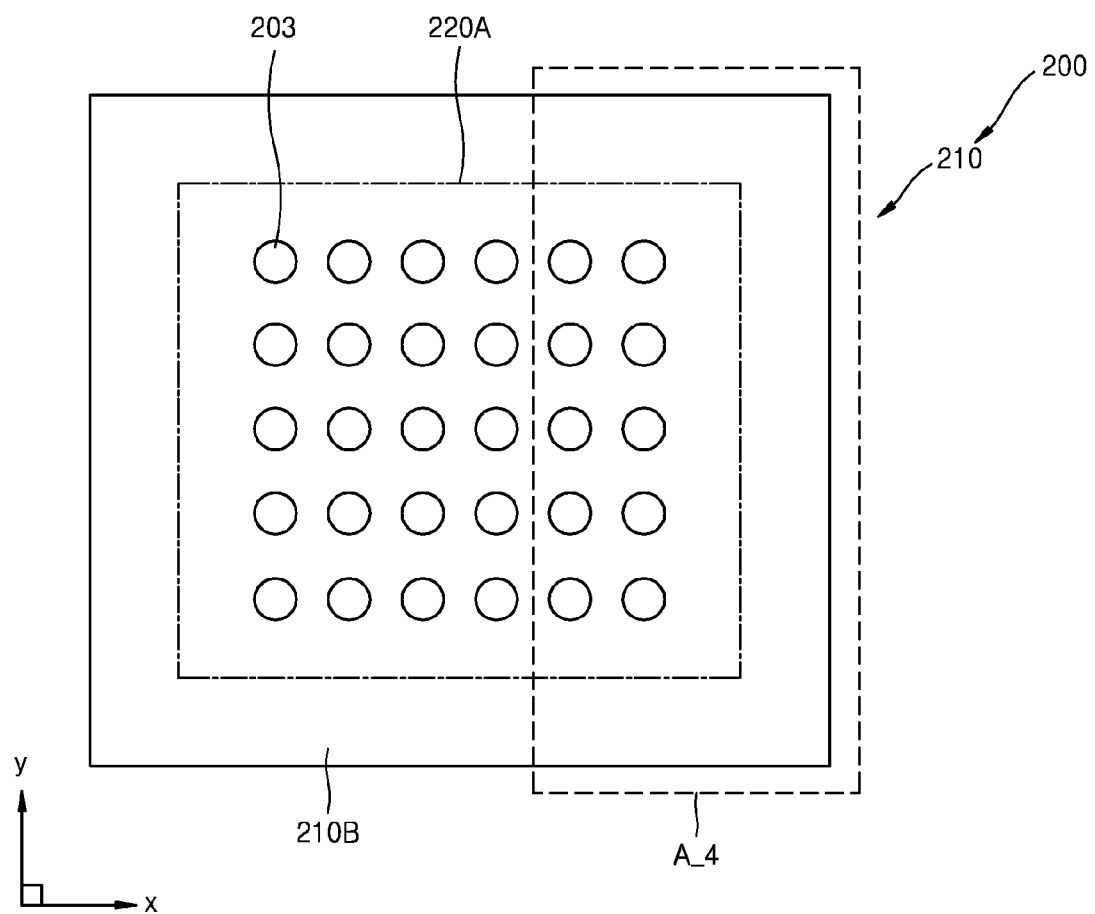
FIG. 2 is a bottom view of a PCB according to another embodiment of the inventive concept.

According to some embodiments, the plurality of solder ball pads 103 are arranged on the lower surface 110B of the PCB 110 to surround the mounting region 120A. However, the plurality of solder ball pads 103 may be arranged in the mounting region 120A as illustrated in FIG. 2 or may be arranged on substantially the entire lower surface 110B of the PCB 110 regardless of the mounting region 120A.

In some embodiments, at least some groups of the plurality of solder ball pads 103 may be arranged in a matrix form.

For example, the first solder ball pad group G1 illustrated in FIG. 1B may be arranged in a somewhat grid shape, with a plurality of solder ball pads 103 arranged in rows and columns. In the first solder ball group G1, at least two pad columns may be disposed at intervals along a first direction (i.e., the X direction of FIG. 1B) with the positions of the pads arranged in respective rows at intervals along a second direction (i.e., the Y direction of FIG. 1B).

On the other hand, at least some groups of the plurality of solder ball pads 103 may be arranged in a staggered matrix form, as shown, for example, in the second solder ball pad group G2 illustrated in FIG. 1B. In the second solder ball pad group G2, the plurality of solder ball pads 103 may be arranged in at least two columns disposed at intervals along the first direction (X direction) and extending along the second direction (Y direction). The positions of the pads along the second direction (Y direction) in one column may be different than the positions (locations) of the pads in the other column (i.e., staggered).

According to some embodiments, the plurality of solder ball pads 103 may be arranged so that some groups are arranged in a matrix shape like the first solder ball pad group G1 and other groups are arranged in a staggered matrix shape like the second solder ball pad group G2. However, the inventive concept is not limited thereto. All of the plurality of solder ball pads 103 may be arranged in a matrix shape (refer to FIG. 2), or all of the plurality of solder ball pads 103 may be arranged in staggered (or athwart) matrices (refer to FIG. 3).

FIG. 1C is a partially enlarged view of region C_1 of FIG. 1B and illustrates some of the solder ball pads 103 included in the second solder ball pad group G2. Specifically, the second solder ball pad group G2 may include one or more radial pad groups RG1, RG2, and RG3. However, not all of the plurality of solder ball pads 103 formed on the lower surface 110B of the PCB 110 need to belong to the radial pad groups, and in some embodiments, only some of the plurality of solder ball pads 103 may belong to the radial pad groups.

According to some embodiments, each of the radial pad groups RG1, RG2, and RG3 is formed of three solder ball pads 103 and the three solder ball pads 103 spaced apart in a radial direction. In some embodiments, solder ball pads 103x, 103y, and 103z (refer to FIG. 1D) may be spaced apart from each other at substantially uniform intervals P1.

Referring to FIG. 1D, region D_1 of FIG. 1C is enlarged so that the structure of the radial pad group RG1 can be described in detail. The solder ball pads 103x, 103y, and 103z of the radial pad group RG1 may be spaced apart in a radial direction at a predetermined angle θ with a vertex of the angle arranged at a center N1 of the radial pad group RG1.

According to some embodiments, the solder ball pads 103x, 103y, and 103z may be arranged at substantially equal angles of about 120°. However, the solder ball pads 103x, 103y, and 103z may be arranged at different angles to adjust the lengths of conductive traces to be described below.

The PCB 110 includes the plurality of traces 150a and 150b. The plurality of conductive traces 150a and 150b may electrically connect the solder ball pads 103 and the conductive pads 105, respectively, to transmit the signals of the semiconductor chip 120 (refer to FIG. 1A) to the plurality of solder balls 140 (refer to FIG. 1A).

According to some embodiments, the radial pad group RG1 may be formed of the three solder ball pads 103x, 103y, and 103z and each of the three solder ball pads 103x, 103y, and 103z may be coupled with a corresponding pair of three pairs of traces 150a and 150b. However, the numbers of solder ball pads and traces formed in one radial pad group are not limited thereto.

According to some embodiments, the plurality of traces 150a and 150b may be illustrated as being exposed to the lower surface 110B of the PCB 110 for the sake of convenience. However, at least some of the plurality of traces 150a and 150b may extend in the PCB 110 or on the upper surface 110T of the PCB 110.

The plurality of first traces 150a may be respectively connected to the solder ball pads 103x, 103y, and 103z and may extend toward the center (i.e., to the inside) of the radial pad group RG1.

The plurality of first traces 150a that extend to the inside of the radial pad group RG1 are respectively connected to the plurality of second traces 150b that extend beyond the perimeter (i.e., to the outside of) the radial pad group RG1. The second traces 150b that extend to the outside of the radial pad group RG1 may be electrically connected with the metal (or conductive) wiring layer (not shown) or the conductive pads 105 formed on the PCB 110 so that the signals of the semiconductor chip 120 (see FIG. 1A) can be transmitted to the plurality of solder balls 140 (refer to FIG. 1A).

In some embodiments, one end of each of the plurality of first traces 150a may extend toward a corresponding one of the solder ball pads 103x, 103y, and 103z and the other end thereof may extend toward the center N1 of the radial pad group.

The three first traces 150a may have substantially equal lengths L1a.

When the three first traces 150a have the equal lengths L1a and the three second traces 150b have substantially equal length L1b, it is possible to substantially prevent signal distortion from occurring in serial transmission when one data item is transmitted through a plurality of signal lines (for example, the three pairs of traces 150a and 150b).

In addition, even when the three first traces 150a have different lengths, when sums of the lengths of each pair of the three pairs of first and second traces 150a and 150b are substantially equal, it is possible to substantially prevent the signal distortion. That is, when the sum of the lengths of the first and second traces connected to the solder ball pad 103x, the sum of the lengths of the first and second traces connected to the solder ball pad 103y, and the sum of the lengths of the first and second traces connected to the solder ball pad 103z are substantially equal, it is possible to prevent the signal distortion from occurring in the serial transmission.

Specifically, for example, in data transmission where the signals respectively transmitted to the solder ball pads 103x, 103y, and 103z are added to generate one data item, the solder ball pads 103x, 103y, and 103z are arranged in the radial direction with respect to the center N1 of the radial pad group and the plurality of first traces 150a are respectively connected to the solder ball pads 103x, 103y, and 103z and extend to the inside of the radial pad group RG1 so that each sum L1a+L1b of the lengths of each pair of the three pairs of first and second traces 150a and 150b may be equal.

Therefore, it is possible to make the signal lines from the semiconductor chip 120 (refer to FIG. 1A) to the solder ball pads 103x, 103y, and 103z have a substantially equal length. This way, it may be possible to substantially prevent the signal distortion or data distortion from occurring when adding the three pairs of signals to generate data.

FIG. 2 is a bottom view of a PCB 210 according to another embodiment of the inventive concept. In FIG. 2, the same reference numerals as those of FIGS. 1A to 1D denote the same elements.

Referring to FIG. 2, the PCB 210 includes a plurality of solder ball pads 203 formed on a lower surface 210B thereof. Hereinafter, for the sake of simplicity, solder balls are not illustrated in FIG. 2.

The lower surface 210B of the PCB 210 includes a mounting region 220A for mounting a semiconductor chip (not shown) on an upper surface (not illustrated) of the PCB 210. The upper surface of the PCB 210 is opposite to the lower surface 210B of the PCB 210.

The plurality of solder ball pads 203 may be arranged in the mounting region 220A, which is a fan-in structure. Since the plurality of solder ball pads 203 and the plurality of solder balls (not shown) have the fan-in structure, it is possible to substantially prevent a connection defect between a semiconductor package including the PCB 210 and a mother substrate (not shown) from occurring due to the warpage of the semiconductor package including the PCB 210.

According to some embodiments, the plurality of solder ball pads 203 are arranged in a matrix shape and a detailed arrangement structure of the plurality of solder ball pads 203 and traces (not shown) will be described later with reference to FIGS. 4A and 4B.

Figure 3:
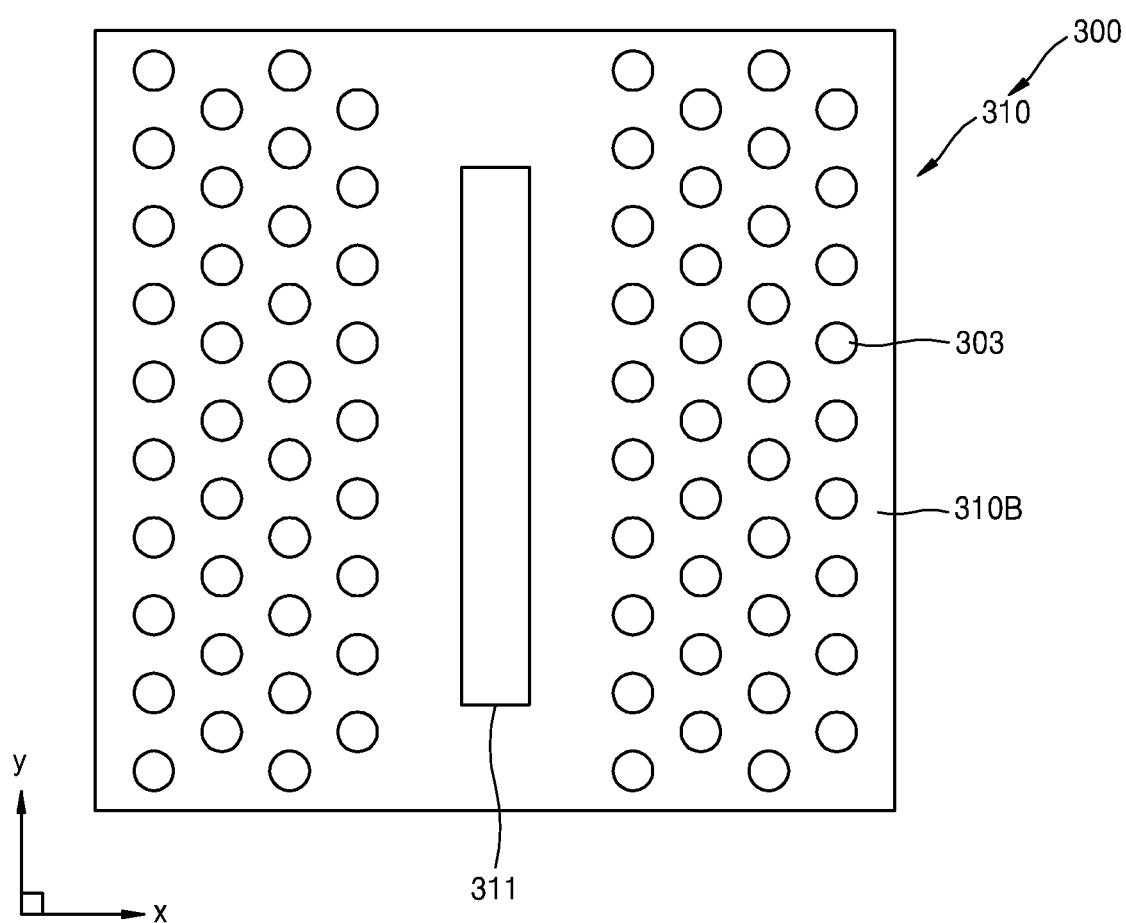
FIG. 3 is a bottom view of a PCB according to another embodiment of the inventive concept.

FIG. 3 is a bottom view of a PCB 310 according to another embodiment of the inventive concept. In FIG. 3, the same reference numerals as those of FIGS. 1A to 2 denote the same elements.

Referring to FIG. 3, the PCB 310 includes an opening (or slit) 311 formed in the center thereof and a plurality of solder ball pads 303 formed on a lower surface 310B thereof.

The opening 311 is formed through the upper and lower surfaces of the PCB 310 so that a semiconductor chip (not shown) may be mounted in a face down type, which will be described in detail later with reference to a BGA package 700 of FIGS. 7A and 7B.

The plurality of solder ball pads 303 are arranged on the lower surface 310B of the PCB 310 to surround the opening 311. According to the current embodiment, the plurality of solder ball pads 303 are arranged in a staggered matrix shape. However, the inventive concept is not limited thereto.

Figure 4A:
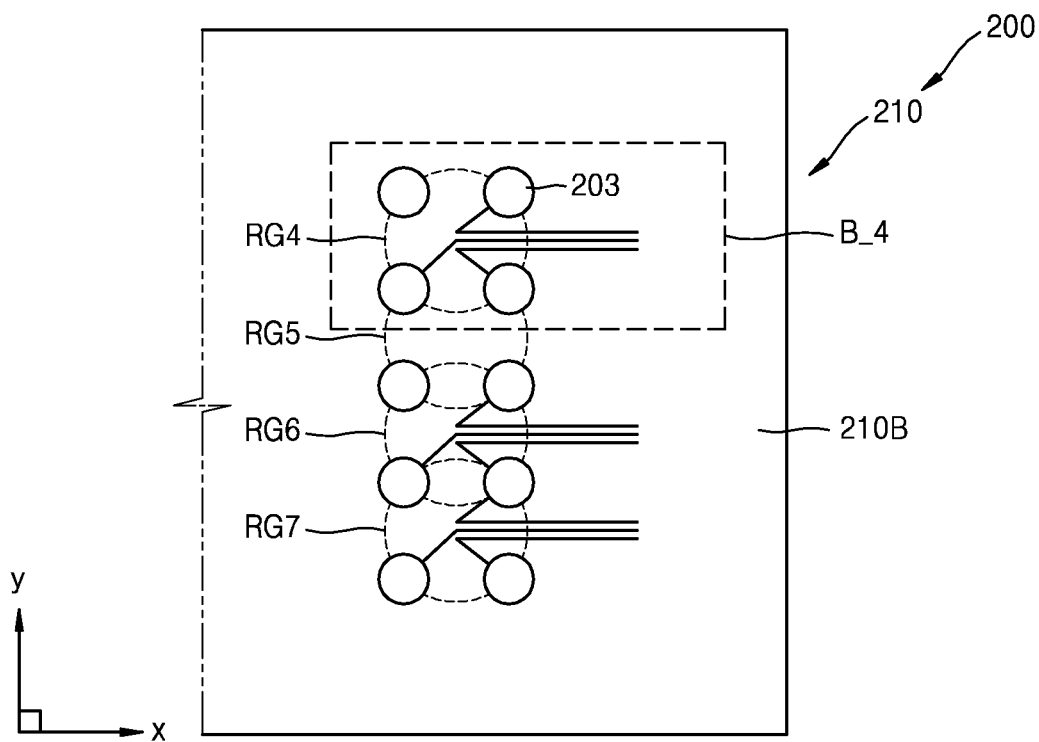
FIG. 4A is a partially enlarged view of the region A_4 of FIG. 2.

FIG. 4A is a partially enlarged view of region A_4 of FIG. 2. FIG. 4B is a partially enlarged view of region B_4 of FIG. 4A. In FIGS. 4A and 4B, the same reference numerals as those of FIGS. 1A to 3 denote the same elements.

Figure 4B:
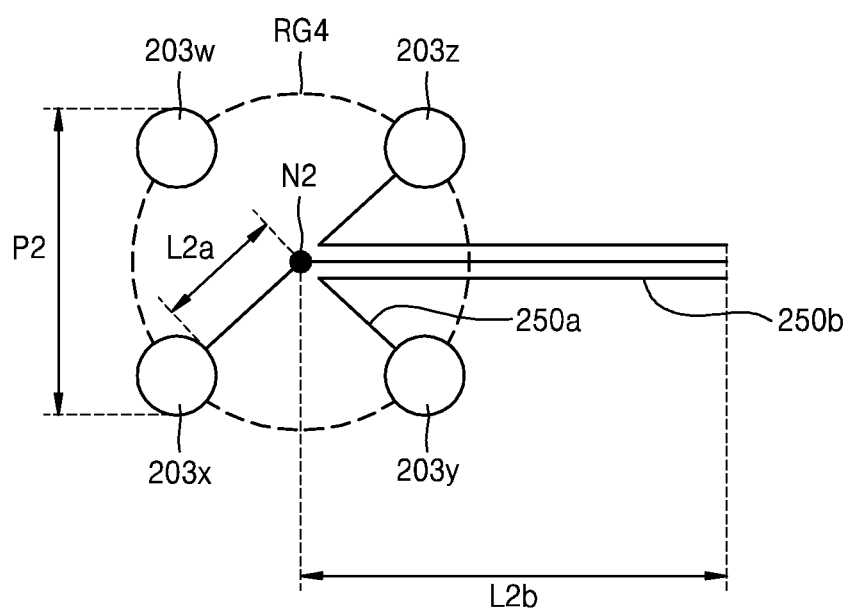
FIG. 4B is a partially enlarged view of the region B_4 of FIG. 4A.

Referring to FIGS. 4A and 4B, the PCB 210 includes the plurality of solder ball pads 203 formed on the lower surface 210B thereof and a plurality of traces 250a and 250b formed thereon.

The plurality of solder ball pads 203 are arranged in a matrix shape to form radial pad groups RG4, RG5, RG6, and RG7.

Each of the radial pad groups RG1, RG2, and RG3 described with reference to FIGS. 1C and 1D includes the solder ball pads 103. However, pairs of pad groups among the radial pad groups RG4, RG5, RG6, and RG7 may share one or more solder ball pads among the plurality of solder ball pads 203. For example, according to the current embodiment, the radial pad group RG4 and the radial pad group RG5 are a pair of pad groups that share two solder ball pads 203.

The plurality of traces 250a and 250b may be electrically connected with the plurality of solder ball pads 203, respectively, so that signals of a semiconductor chip (not shown) may be transmitted to solder balls (not shown).

According to some embodiments, each of the radial pad groups RG4, RG5, RG6, and RG7 is formed of four solder ball pads 203 and each of the radial pad groups RG4, RG6, and RG7 is coupled with the three pairs of traces 250a and 250b.

According to some embodiments, the plurality of traces 250a and 250b are illustrated as being exposed to the lower surface 210B of the PCB 210. However, at least some of the plurality of traces 250a and 250b may extend in (or through) the PCB 210 or on the upper surface 210T of the PCB 210.

The plurality of first traces 250a may be respectively connected to the three solder ball pads 203 that belong to the radial pad group RG4 to extend to the inside of the radial pad group RG4.

The plurality of first traces 250a that extend to the inside of the radial pad group RG4 are respectively connected to the plurality of second traces 250b to extend to the outside of the radial pad group RG4. The plurality of second traces 250b that extend to the outside of the radial pad group RG4 are electrically combined with a metal wiring layer (not shown) or conductive pads (not shown) formed on the PCB 210 so that the signals of the semiconductor chip (not shown) are transmitted to the solder balls (not shown).

In some embodiments, one end of each of the plurality of first traces 250a may extend toward each of the solder ball pads 203 and other end thereof may extend toward a center of the radial pad group.

The three first traces 250a may have a substantially equal length L2a.

As described with reference to FIGS. 1C and 1D, when the three first traces 250a have substantially the equal length L2a and the three second traces 250b have equal lengths L2b, it is possible to prevent signal distortion from occurring in serial transmission when one data item is transmitted through a plurality of signal lines.

In addition, even when the three first traces 250a have different lengths, when sums of the lengths of each pair of the three pairs of first and second traces 250a and 250b are equal, it is possible to substantially prevent the signal distortion. That is, when the sum of the lengths of the first and second traces connected to the solder ball pad 203x, the sum of the lengths of the first and second traces connected to the solder ball pad 203y, and the sum of the lengths of the first and second traces connected to the solder ball pad 203z are equal, it is possible to substantially prevent the signal distortion from occurring in the serial transmission.

In some embodiments, for example, during data transmission when the signals respectively transmitted to the solder ball pads 203x, 203y, and 203z are added to generate one data item, the solder ball pads 203x, 203y, and 203z may be arranged at equidistant intervals along the radial direction, with the radial pad group having a center N2. The plurality of first traces 250a are respectively connected to the solder ball pads 203x, 203y, and 203z and extend to the inside of the radial pad group RG4 so that sums L2a+L2b of the lengths of each pair of the three pairs of first and second traces 250a and 250b may be substantially equal. Therefore, it is possible to make the signal lines from the semiconductor chip (not shown) to the solder ball pads 203x, 203y, and 203z have a substantially equal length, which makes it possible to substantially prevent the signal distortion or data distortion from occurring in adding the three pairs of signals to generate data.

Figure 5:
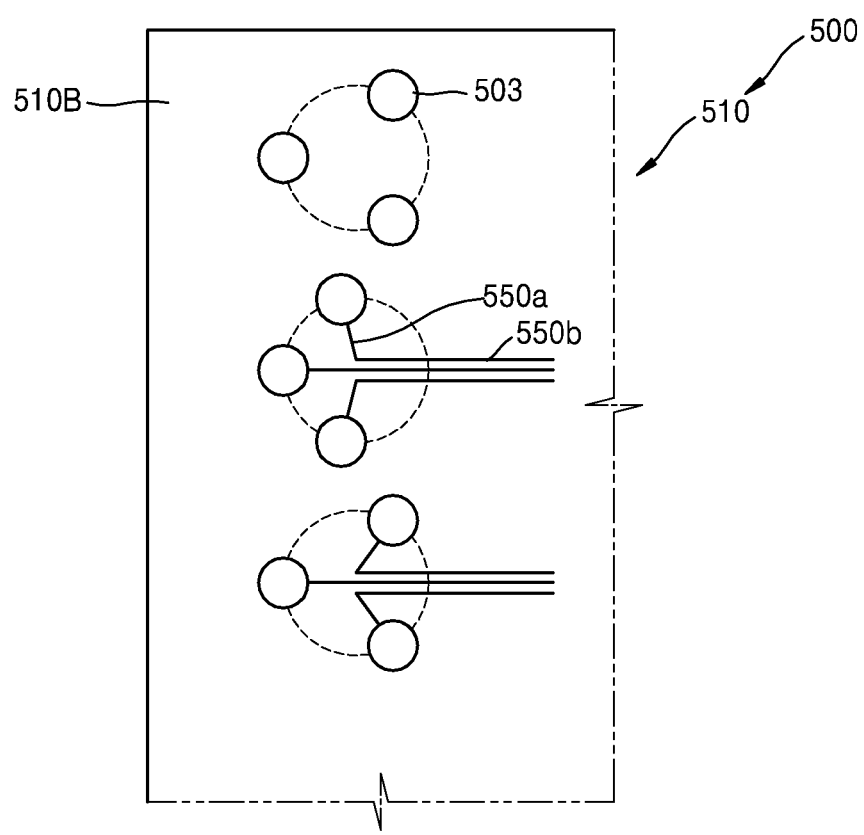
FIG. 5 is a view illustrating a partial configuration of a bottom view of a PCB according to another embodiment of the inventive concept.

FIG. 5 is a view illustrating a partial configuration of a bottom view of a PCB 510 according to some embodiments.

Referring to FIG. 5, the PCB 510 includes a plurality of solder ball pads 503 formed on a lower surface 510B thereof and a plurality of traces 550a and 550b formed thereon.

In FIGS. 1A to 4B, the plurality of solder ball pads 103, 203, 303, and 403 form radial groups having regularly arranged (i.e., equally spaced) solder ball pads. However, the plurality of solder ball pads 503 may be irregularly arranged (or unevenly spaced) as occasion demands. The plurality of solder ball pads 503 form radial groups like the plurality of solder ball pads 103, 203, 303, and 403 so that it is possible to make each sum of the lengths of each pair of the three pairs of first and second traces 550a and 550b equal and to prevent the signal distortion from occurring in the semiconductor chip (not shown) like in the above-described other embodiments.

Figure 6B:
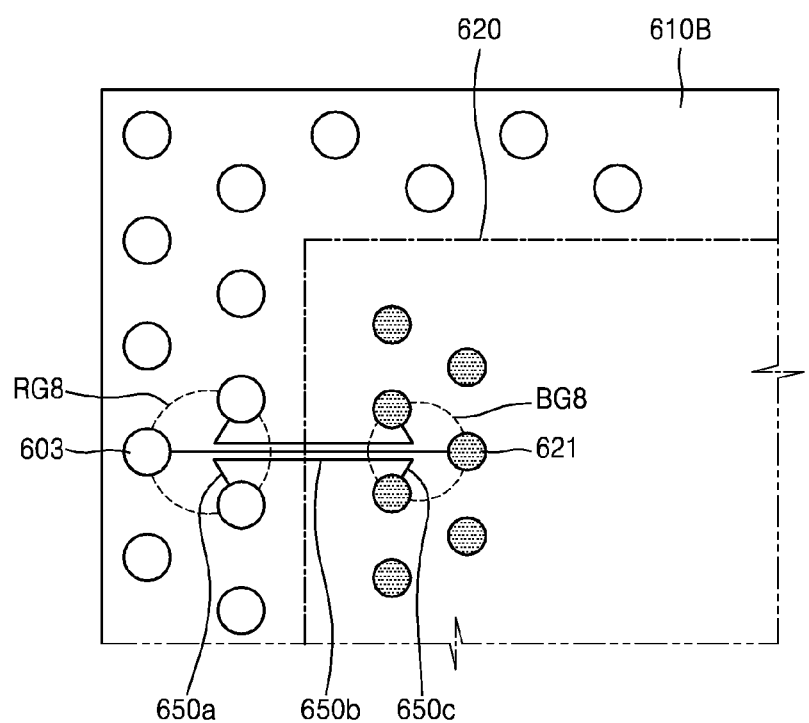

FIGS. 6A and 6B are views illustrating a BGA package 600 including a PCB 610 according to some embodiments. FIG. 6A is a cross-sectional view of the BGA package 600. FIG. 6B is a bottom view of the PCB 610 corresponding to region B_6 of FIG. 6A. In FIGS. 6A and 6B, the same reference numerals as those of FIGS. 1A to 5 denote the same elements and repeated description of the elements will not be given.

Referring to FIG. 6A, the BGA package 600 includes the PCB 610, a semiconductor chip 620 mounted on an upper surface 610T of the PCB 610, a plurality of bumps 621 for connecting the PCB 610 and the semiconductor chip 620, a mold unit 630 formed to cover the upper surface 610T of the PCB 610 and the semiconductor chip 620, and solder balls 640 attached to a lower surface 610B of the PCB 610.

The PCB 610 includes a base substrate 601 and a plurality of solder ball pads 603.

In addition, the PCB 610 may further include at least one insulating layer (not shown) and a metal wiring layer (not shown), bump pads (not shown) for connecting the PCB 610 and the bumps 621, and a via contact (not shown) for connecting the bump pads and the solder ball pads 603 through upper and lower surfaces of the base substrate 601 opposite to each other.

Furthermore, the PCB 610 may further include a protective layer (not shown) that exposes only the bumps 621 and the solder ball pads 603, but covers all remaining regions. The protective layer may be SMD such that the bumps 621 and the solder ball pads 603 are partially exposed or may be NSMD such that the bumps 621 and the solder ball pads 603 are entirely exposed.

The base substrate 601 may be a flat plate including the upper and lower surfaces opposite to each other. The base substrate 601 may include, for example, an epoxy resin, etc., and may have a structure similar to that of the base substrate 101 of FIG. 1A. Therefore, a detailed description of the base substrate 601 will not be given.

The plurality of solder ball pads 603 are formed on the lower surface of the base substrate 601 and the plurality of solder balls 640 are respectively attached to the plurality of solder ball pads 603.

The solder ball pads 603 may be electrically coupled with the metal wiring layer (not shown) or the bumps 621 that may be formed on the PCB 610 so that signals of the semiconductor chip 620 may be transmitted to the plurality of solder balls 640.

The solder ball pads 603 may be formed at substantially the same level with a lower surface 610B of the PCB 610 as illustrated in FIG. 6A. However, the inventive concept is not limited thereto. The solder ball pads 603 may be formed at a lower level than the lower surface 610B of the PCB 610 and protrude therefrom or may be formed at a higher level than the lower surface 610B of the PCB 610 and be buried therein.

The semiconductor chip 620 is mounted on the upper surface 610T of the PCB 610. The semiconductor chip 620 may be as a memory device, a logic device, a microprocessor, an analog device, a digital signal processor, and a system-on-chip like the semiconductor chip 120 described in detail with reference to FIG. 1A. In addition, the semiconductor chip 620 may be a multi-chip structure where at least two semiconductor chips are stacked.

As illustrated in FIG. 6A, when the semiconductor chip 620 is mounted on the PCB 610 by flip-chip bonding, the semiconductor chip 620 is coupled with the PCB 610 through the bumps 621.

On the other hand, in the semiconductor package where the flip-chip bonding is used, the mold unit 630 may be formed by a molded under fill (MUF) process. In the MUF process, the space between the semiconductor chip 620 and the PCB 610 may be filled with the mold unit 630 without additionally performing a process of filling the space between the semiconductor chip 620 and the PCB 610 with under fill (not shown) as illustrated in FIG. 2. When the mold unit 630 is formed by the MUF process, the molding material that forms a portion of the mold unit 630 that covers an outside surface of the semiconductor chip 620 may be the same as the molding material that forms another portion of the mold unit 630 that is disposed between the semiconductor chip 620 and the PCB 610.

The mold unit 630 may be formed without using the MUF process. That is, the space between the semiconductor chip 620 and the PCB 610 may be filled with the under fill (not shown) and then, the outside surface of the semiconductor chip 620 may be covered with an external molding member (not shown) so that a molding process may be performed. The under fill (not shown) for filling the space between the semiconductor chip 620 and the PCB 610 and the external molding member (not shown) that covers the outside surface of the semiconductor chip 620 may be formed of the same material or different materials.

Referring to FIG. 6B, the PCB 610 may include the plurality of solder ball pads 603 formed on the lower surface 610B thereof, the plurality of bumps 621 attached to the upper surface 610T thereof, and a plurality of traces 650a, 650b, and 650c for connecting the plurality of solder ball pads 603 and the plurality of bumps 621.

The bumps 621 are attached to the upper surface 610T of the PCB 610 (refer to FIG. 6A). However, in FIG. 6B, the bumps 621 are illustrated on the lower surface 610B of the PCB 610 in order to describe a connection relationship among the bumps 621, the solder ball pads 603, and the traces 650a, 650b, and 650c.

In addition, according to some embodiments, the plurality of traces 650a, 650b, and 650c are illustrated as being exposed to the lower surface 610B of the PCB 610. However, at least some of the plurality of traces 650a, 650b, and 650c may extend in (or through) the PCB 610 or on the upper surface 610T of the PCB 610.

Furthermore, the plurality of traces 650a, 650b, and 650c may directly connect the bumps 621 and the solder ball pads 603, respectively, without passing through other conductors (not shown). Alternatively, the bumps 621 and the solder ball pads 603 may be electrically connected via a metal wiring layer (not shown), bump pads (not shown), and via contacts (not shown) formed on the PCB 610 as well as the plurality of traces 650a, 650b, and 650c.

At least some of the plurality of solder ball pads 603 may be arranged to form at least one radial pad group RG8 and at least some of the plurality of bumps 621 may be arranged to form at least one radial bump group BG8.

The plurality of traces 650a, 650b, and 650c may electrically connect the bumps 621 and the solder ball pads 603, respectively, so that the signals of the semiconductor chip 620 (refer to FIG. 6A) may be transmitted to the plurality of solder balls 640.

Specifically, the plurality of first traces 650a are respectively connected to the solder ball pads 603 to extend to the inside of the radial pad group RG8.

The plurality of third traces 650c are respectively connected to the bumps 621 to extend to the inside of the radial bump group BG8.

One end of each of the plurality of second traces 650b extends to the inside of the radial pad group RG8 to be connected to each of the plurality of first traces 650a and the other end thereof extends to the inside of the radial bump group BG8 to be connected to each of the plurality of third traces 650c.

In some embodiments, one end of each of the plurality of first traces 650a may extend toward a corresponding one of the solder ball pads 603 that belong to the radial pad group RG8 and the other end thereof may extend toward the center of the radial pad group RG8.

Similarly, one end of each of the plurality of third traces 650c may extend toward a corresponding one of the bumps 621 that belong to the radial bump group BG8 and other end thereof may extend toward the center of the radial bump group BG8.

The plurality of third traces 650c may have a substantially equal length. When the plurality of first traces 650a have a substantially equal length, the plurality of second traces 650b have a substantially equal length, and the plurality of third traces 650c have a substantially equal length, it may be possible to substantially prevent signal distortion from occurring in serial transmission when one data item is transmitted through a plurality of signal lines (for example, the plurality of traces 650a, 650b, and 650c).

In addition, even when the plurality of third traces 650c have different lengths, when sums of the lengths of each set of the plurality of first, second, and third traces 650a, 650b, and 650c for respectively connecting the solder ball pads 603 and the bumps 621 are equal, it is possible to substantially prevent the signal distortion.

Figures 7A, 7B:
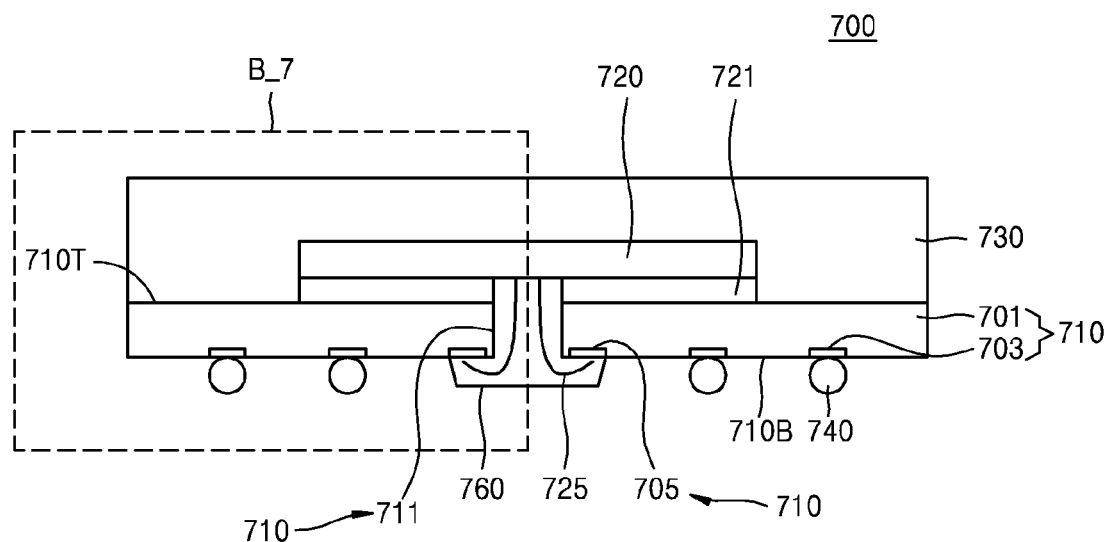
FIGS. 7A and 7B are views illustrating a BGA package including a PCB according to another embodiment of the inventive concept.

FIGS. 7A and 7B are views illustrating a BGA package 700 including a PCB 710 according to some embodiments. FIG. 7A is a cross-sectional view of the BGA package 700. FIG. 7B is a bottom view of the PCB 710 corresponding to the region B_7 of FIG. 7A. In FIGS. 7A and 7B, the same reference numerals as those of FIGS. 1A to 6B denote the same elements.

Referring to FIG. 7A, the BGA package 700 may include the PCB 710, a semiconductor chip 720 mounted on an upper surface 710T of the PCB 710, an adhesive layer 721 for attaching the semiconductor chip 720 to the upper surface 710T of the PCB 710, bonding wires 725 for connecting the PCB 710 and the semiconductor chip 720, a first mold unit 730 that covers the upper surface 710T of the PCB 710 and the semiconductor chip 720, a second mold unit 760 that covers a part of a lower surface 710B of the PCB 710 and a part of a lower surface 720B of the semiconductor chip 720, and solder balls 740 attached to the lower surface 710B of the PCB 710.

The PCB 710 includes a base substrate 701, an opening (or slit) 711 formed in a center of the PCB 710, and a plurality of solder ball pads 703 and conductive pads 705 formed on the lower surface 710B of the PCB 710. In addition, the PCB 710 may include at least one insulating layer (not shown) and metal wiring layer (not shown). Furthermore, the PCB 710 may further include a protective layer (not shown) that exposes only the solder ball pads 703 and the conductive pads 705 and covers all remaining region. The protective layer may be SMD so that the solder ball pads 703 and the conductive pads 705 are partially exposed or may be NSMD so that the solder ball pads 703 and the conductive pads 705 are entirely exposed.

According to some embodiments, the PCB 710 may have a structure similar to that of the PCB 310 described with reference to FIG. 3. Therefore, a detailed description of the PCB 710 will not be given.

The semiconductor chip 720 is mounted on the upper surface 710T of the PCB 710. The semiconductor chip 720 may be a memory device, a logic device, a microprocessor, an analog device, a digital signal processor, and a system-on-chip like the semiconductor chip 120 described in detail with reference to FIG. 1A. In addition, the semiconductor chip 720 may be a multi-chip having a structure in which at least two semiconductor chips are stacked.

According to some embodiments, the semiconductor chip 720 is mounted in a face-down type arrangement. Specifically, chip conductive pads 723 (refer to FIG. 7B) of the semiconductor chip 720 are arranged in a central region of the semiconductor chip 720 along the lower surface 720B thereof and are electrically connected to the bonding wires 725 that extend through the opening 711 formed in the PCB 710. The second mold unit 760 is formed to cover a portion of the lower surface 710B of the PCB 710, a portion of the lower surface 720B of the semiconductor chip 720, and the bonding wires 725 to protect the bonding wires 725 against external impacts.

The first mold unit 730 may be formed of a material similar to that of the mold unit 130 described with reference to FIG. 1A by manufacturing processes similar to those for forming the mold unit 130 described with reference to FIG. 1A.

The first mold unit 730 and the second mold unit 760 may be formed of the same material in a single process. However, the inventive concept is not limited thereto. The second mold unit 760 may be formed of a material different from that of the first mold unit 730 by manufacturing processes different from those for forming the first mold unit 730.

Referring to FIG. 7B, the PCB 710 includes the plurality of solder ball pads 703 and conductive pads 705 formed on the lower surface 710B thereof and a plurality of traces 750a and 750b for respectively connecting the plurality of solder ball pads 703 and conductive pads 705.

The chip conductive pads 723 formed on the lower surface 720B of the semiconductor chip 720 are electrically connected to the bonding wires 725 that extend through the opening 711 of the PCB 710. The bonding wires 725 may connect the conductive pads 705 and the chip conductive pads 723 so that signals of the semiconductor chip 720 may be transmitted to the solder ball pads 703.

In the current embodiment, the plurality of traces 750a and 750b are illustrated as being exposed to the lower surface 710B of the PCB 710 for convenience sake. However, at least some of the plurality of traces 750a and 750b may extend in the PCB 710 or on the upper surface 710T of the PCB 710.

Furthermore, according to the current embodiment, the plurality of traces 750a and 750b may directly respectively connect the solder ball pads 703 and the conductive pads 705 without passing through other conductors (not shown) or the solder ball pads 703 and the conductive pads 705 may be electrically connected via a metal wiring layer (not shown) formed on the PCB 710 as well as the plurality of traces 750a and 750b.

At least some of the plurality of solder ball pads 703 may be arranged to form at least one radial pad group RG9.

The plurality of traces 750a and 750b may electrically respectively connect the solder ball pads 703 and the conductive pads 705 so that the signals of the semiconductor chip 720 (refer to FIG. 7A) may be transmitted to the solder ball pads 703.

Specifically, the plurality of first traces 750a are respectively connected to the solder ball pads 703 and extend to the inside of the radial pad group RG9.

One end of each of the plurality of second traces 750b extends to the inside of the radial pad group RG9 to be connected to a corresponding one of the plurality of first traces 750a and other end thereof is connected to a corresponding one of the conductive pads 705.

In some embodiments, one end of each of the plurality of first traces 750a may extend toward each of the solder ball pads 703 that belong to the radial pad group RG9 and other end thereof may extend toward the center of the radial pad group RG9.

The plurality of first traces 750a may have a substantially equal length. When the plurality of first traces 750a have substantially the equal length and the plurality of second traces 750b have a substantially equal length, it is possible to substantially prevent signal distortion from occurring in serial transmission when one data item is transmitted through a plurality of signal lines.

In addition, even when the plurality of first traces 750a have different lengths, when sums of the lengths of each pair of the pairs of first and second traces 750a and 750b are equal, it may be possible to prevent the signal distortion.

Figure 8:
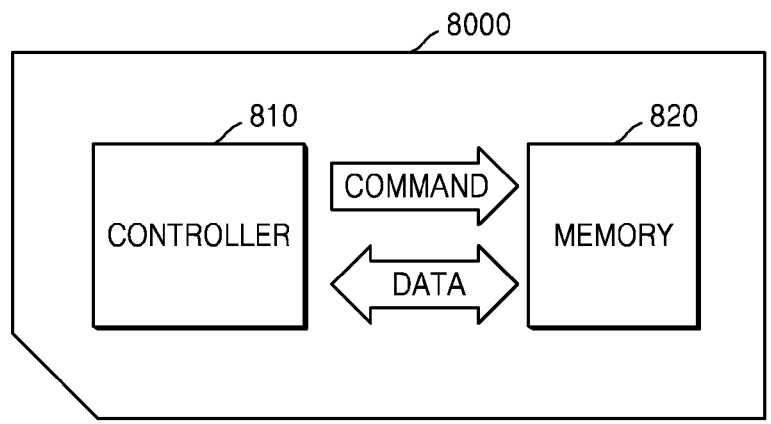
FIG. 8 is a view schematically illustrating a memory card including the BGA package according to an embodiment of the inventive concept.

FIG. 8 is a view schematically illustrating a memory card 8000 including the BGA package according to an embodiment of the inventive concept.

Referring to FIG. 8, a controller 810 and a memory device 820 may exchange electrical signals. For example, when a command is issued by the controller 810, the memory device 820 may transmit data.

At least one of the controller 810 and the memory 820 may be one of the BGA packages 100, 200, 300, 400, 500, 600, and 700 described with reference to FIGS. 1 to 7B.

The memory card 8000 may be used for various portable electronic apparatuses, for example, a memory apparatus such as a multimedia card (MMC) and a secure digital (SD) card.

Figure 9:
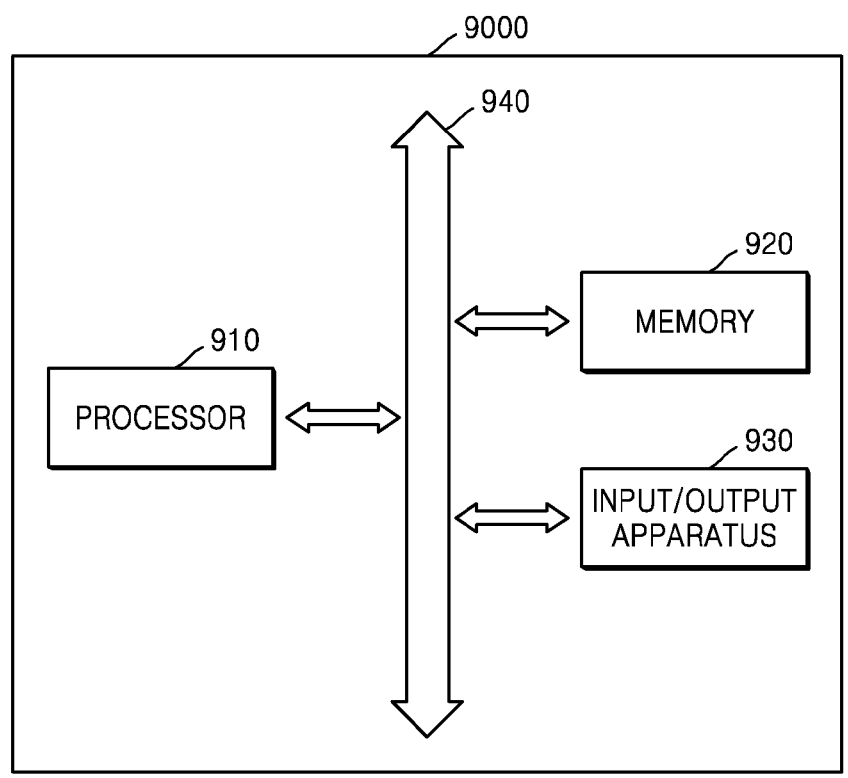
FIG. 9 is a block diagram illustrating a system including the BGA package according to an embodiment of the inventive concept.

FIG. 9 is a block diagram illustrating a system 9000 including the BGA package according to an embodiment of the inventive concept.

Referring to FIG. 9, a processor 910, an input/output apparatus 930, and a memory 920 may communicate with each other by using a bus 940.

The processor 910 may execute programs and control the system 9000.

The memory 920 may store codes and data for operating the processor 910. At least one of the processor 910 and the memory 920 may be one of the BGA packages 100, 200, 300, 400, 500, 600, and 700 described with reference to FIGS. 1 to 7B.

The input/output apparatus 930 may be used for inputting or outputting data of the system 9000. The system 9000 may be connected to an external apparatus, for example, a personal computer (PC) or a network by using the input/output apparatus 930 to exchange data with the external apparatus.

The system 9000 may be used for various electronic devices such as a mobile phone, an MP3 player, a navigator, and a solid state disk (SSD).

Figure 10:
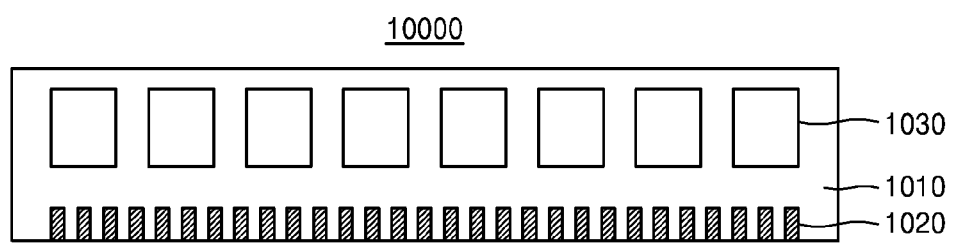
FIG. 10 is a view schematically illustrating a semiconductor module including the BGA package according to an embodiment of the inventive concept.

FIG. 10 is a view schematically illustrating a semiconductor module 10000 including the BGA package according to an embodiment of the inventive concept.

Referring to FIG. 10, the semiconductor module 10000 may include a module board 1010, a plurality of contact terminals 1020, and a plurality of semiconductor packages 1030.

The module board 1010 may be, for example, a mother substrate. The plurality of contact terminals 1020 may be formed on a side surface of the module board 1010 and may be electrically connected to the plurality of semiconductor packages 1030.

The plurality of semiconductor packages 1030 may be mounted on the module board 1010. At least one of the plurality of semiconductor packages 1030 may be one of the BGA packages 100, 200, 300, 400, 500, 600, and 700 described with reference to FIGS. 1 to 7B.

Figure 11:
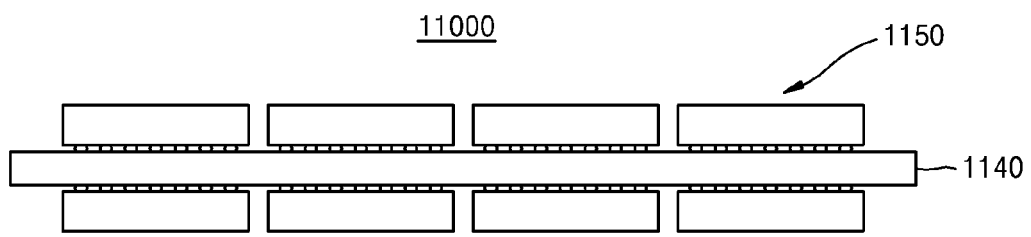
FIG. 11 is a view schematically illustrating a semiconductor module including the BGA package according to another embodiment of the inventive concept.

FIG. 11 is a view schematically illustrating a semiconductor module 11000 including the BGA package according to another embodiment of the inventive concept.

Referring to FIG. 11, the semiconductor module 11000 may include a module board 1140 and a plurality of semiconductor packages 1150 mounted on the module board 1140.

The module board 1140 may be, for example, a mother substrate. At least one of the plurality of semiconductor packages 1150 may be one of the BGA packages 100, 200, 300, 400, 500, 600, and 700 described with reference to FIGS. 1 to 7B.

While the inventive concept has been particularly shown and described with reference to exemplary embodiments thereof, it will be understood that various changes in form and details may be made therein without departing from the spirit and scope of the following claims.

What is claimed is:

1. A printed circuit board (PCB), comprising:
a base substrate including upper and lower surfaces opposite to each other;
a plurality of solder ball pad groups formed on the lower surface of the base substrate, each solder ball pad group comprising a plurality of solder ball pads radially arranged with respect to a center of the solder ball pad group;
a plurality of first traces respectively connected to the plurality of solder ball pads of at least one solder ball pad group and extending to an inside of the at least one solder ball pad group; and
a plurality of second traces respectively connected to the plurality of first traces and extending to an outside of the at least one solder ball pad group.

2. The PCB of claim 1, wherein the plurality of first traces each have substantially an equal length.

3. The PCB of claim 1, wherein the plurality of solder ball pads are arranged at substantially uniform intervals.

4. The PCB of claim 1,
wherein one end of each of the plurality of first traces extends toward a corresponding one of the plurality of solder ball pads, and
the other end of each of the plurality of first traces extends toward the center of the at least one solder ball pad group.

5. The PCB of claim 1, wherein solder ball pads that belong to the at least one solder ball pad group are arranged at substantially an equal angle with respect to the center of the at least one solder ball pad group.

6. The PCB of claim 1,
wherein the PCB further comprises an opening formed in a center thereof, and
the plurality of solder ball pads surround the opening.

7. The PCB of claim 1, wherein a pair of the one solder ball groups share one or more solder ball pads.

8. A ball grid array (BGA) package, comprising:
a PCB including upper and lower surfaces opposite to each other;
a semiconductor chip mounted on the upper surface of the PCB; and
a plurality of solder balls attached to a plurality of solder ball pads formed on the lower surface of the PCB,
wherein the plurality of solder ball pads are arranged in at least one group, the solder ball pads of at least one group being radially arranged with respect to a center of the group, and
wherein the PCB comprises:
a plurality of first traces respectively connected to the plurality of solder ball pads of the at least one group and extending to an inside of the group; and
a plurality of second traces respectively connected to the plurality of first traces and extending to an outside of the at least one group.

9. The BGA package of claim 8, wherein the semiconductor chip is mounted on the PCB by flip-chip bonding through a plurality of bumps.

10. The BGA package of claim 9, wherein at least some of the plurality of bumps form one or more radial bump groups, and the plurality of bumps forming at least one radial bump group being arranged with respect to a center of the radial bump group.

11. The BGA package of claim 10,
wherein the PCB further comprises a plurality of third traces respectively connected to the plurality of bumps of a radial bump group and extending to an inside of the radial bump group,
wherein one end of each of the plurality of second traces is connected to a corresponding one of the plurality of first traces, and
the other end of each of the plurality of second traces extends to the inside of the radial bump group and is connected to a corresponding one of the plurality of third traces.

12. The BGA package of claim 8, further comprising:
an adhesive layer for attaching the semiconductor chip and the PCB;
conductive pads formed on an upper surface of the semiconductor chip; and
wires for electrically connecting the conductive pads and the PCB.

13. The BGA package of claim 8,
wherein the semiconductor chip is mounted on the upper surface of the PCB in a face-down manner,
wherein the PCB comprises first conductive pads, each of which is electrically connected to one end of each of the plurality of second traces, and an opening that exposes second conductive pads formed on a lower surface of the semiconductor chip, and
wherein the first conductive pads and the second conductive pads are connected by wire bonding.

14. The BGA package of claim 8,
wherein the lower surface of the PCB comprises a mounting region corresponding to a region in which the semiconductor chip is mounted on the upper surface of the PCB, and
the plurality of solder ball pads surround the mounting region.

15. The BGA package of claim 8,
wherein the lower surface of the PCB comprises a mounting region to mount the semiconductor chip on the upper surface of the PCB, and
the plurality of solder ball pads are arranged in the mounting region.

16. A printed circuit board (PCB), comprising:
a substrate; and
a plurality of conductive traces formed on the substrate, the plurality of conductive traces respectively connected to a plurality of solder ball pads that form at least one radial pad group, the plurality of conductive traces extending to an outside of the at least one radial pad group, the plurality of solder ball pads that form the at least one radial pad group being substantially radially arranged with respect to a center region of the at least one radial pad group,
wherein each of the plurality of conductive traces has a substantially equal length, and
wherein the plurality of conductive traces comprises a plurality of first conductive traces respectively connected to the plurality of solder ball pads and extending to the inside of the at least one radial pad group and a plurality of second conductive traces respectively connected to the plurality of first conductive traces and extending beyond a perimeter of the at least one radial pad group.

17. The PCB of claim 16, wherein the plurality of first conductive traces have substantially equal lengths.

18. The PCB of claim 16, wherein one end of each of the plurality of first conductive traces extends toward a corresponding one of the plurality of solder ball pads and the other end thereof extends toward the center region of the radial pad group.

19. The PCB of claim 16, wherein the plurality of solder ball pads are spaced apart from each other at substantially uniform intervals.

20. The PCB of claim 16, wherein the plurality of solder ball pads of the at least one radial pad group are spaced apart in a radial direction at a predetermined angle with a vertex of the angle arranged at a substantial center of the center region of the at least one radial pad group.

* * * * *